US008910375B2

(12) United States Patent
Nakai et al.

(10) Patent No.: US 8,910,375 B2
(45) Date of Patent: Dec. 16, 2014

(54) MOUNTING APPARATUS

(75) Inventors: Seiya Nakai, Chikushi-gun (JP); Shinichi Sakurada, Chuo-ku (JP)

(73) Assignees: Adwelds Corporation, Fukuoka (JP); Elpida Memory, Inc., Tokyo (JP)

( * ) Notice: Subject to any disclaimer, the term of this patent is extended or adjusted under 35 U.S.C. 154(b) by 874 days.

(21) Appl. No.: 12/997,722

(22) PCT Filed: Jun. 2, 2009

(86) PCT No.: PCT/JP2009/060051
§ 371 (c)(1),
(2), (4) Date: Dec. 13, 2010

(87) PCT Pub. No.: WO2009/150962
PCT Pub. Date: Dec. 17, 2009

(65) Prior Publication Data
US 2011/0088257 A1    Apr. 21, 2011

(30) Foreign Application Priority Data
Jun. 12, 2008   (JP) ................. 2008-154057

(51) Int. Cl.
*B23P 19/00* (2006.01)
*H01L 21/687* (2006.01)
*H01L 23/00* (2006.01)
*H01L 21/67* (2006.01)

(52) U.S. Cl.
CPC ....... *H01L 21/67092* (2013.01); *H01L 2224/75* (2013.01); *H01L 2924/01005* (2013.01); *H01L 2924/014* (2013.01); *H01L 21/68728* (2013.01); *H01L 2224/758* (2013.01); *H01L 2224/16* (2013.01); *H01L 2924/01006* (2013.01); *H01L 2924/01033* (2013.01); *H01L 24/75* (2013.01); *H01L 2924/01082* (2013.01); *H01L 2924/01075* (2013.01); *H01L 21/68742* (2013.01); *H01L 2924/01004* (2013.01); *H01L 2924/01029* (2013.01); *H01L 2924/01013* (2013.01); *H01L 2924/01023* (2013.01); *Y10S 269/903* (2013.01)
USPC ............... 29/740; 29/760; 29/832; 269/903

(58) Field of Classification Search
CPC ............... H01L 21/67092; H01L 21/68742; H01L 24/75; H01L 21/68728
USPC ........ 29/739–744, 760, 832; 269/21, 25, 152, 269/903
See application file for complete search history.

(56) References Cited

U.S. PATENT DOCUMENTS

| | | | |
|---|---|---|---|
| 6,206,352 B1 * | 3/2001 | Ishitani et al. ............ | 269/21 |
| 6,941,646 B2 * | 9/2005 | Suhara ..................... | 29/740 |
| 7,513,032 B2 * | 4/2009 | Shimamura et al. ....... | 29/740 |
| 2005/0034302 A1 | 2/2005 | Hosotani et al. | |

FOREIGN PATENT DOCUMENTS

| | | |
|---|---|---|
| CN | 1578600 | 2/2005 |
| JP | 1-155694 | 6/1989 |

(Continued)

*Primary Examiner* — Donghai D Nguyen
(74) *Attorney, Agent, or Firm* — Jordan and Hamburg LL

(57) ABSTRACT

The purpose of the invention is to provide a mounting apparatus that can mount a part such as a chip, etc. on a substrate effectively and precisely. A wafer is placed on the upper surface of turntable, which has opening section, and a backup section and a head section that hold a chip are lifted up and lowered respectively, at opening section. The wafer and the chip are contacted, pinched and held locally, and then they are heat-bonded. After that, the backup section and the head section are removed. Lift arms equipped on a holding table are inserted between the wafer and turntable, the wafer is lifted up, and opening section is moved relative to the wafer when turntable is rotated. The wafer is placed on turntable again and the bonding process is performed.

5 Claims, 13 Drawing Sheets

(56) References Cited

FOREIGN PATENT DOCUMENTS

| | | |
|---|---|---|
| JP | 4-199525 | 7/1992 |
| JP | 8-307099 | 11/1996 |
| JP | 10-335391 | 12/1998 |
| JP | 2000-244198 | 9/2000 |
| JP | 2006-286659 | 10/2006 |
| JP | 2007-012802 | 1/2007 |

* cited by examiner

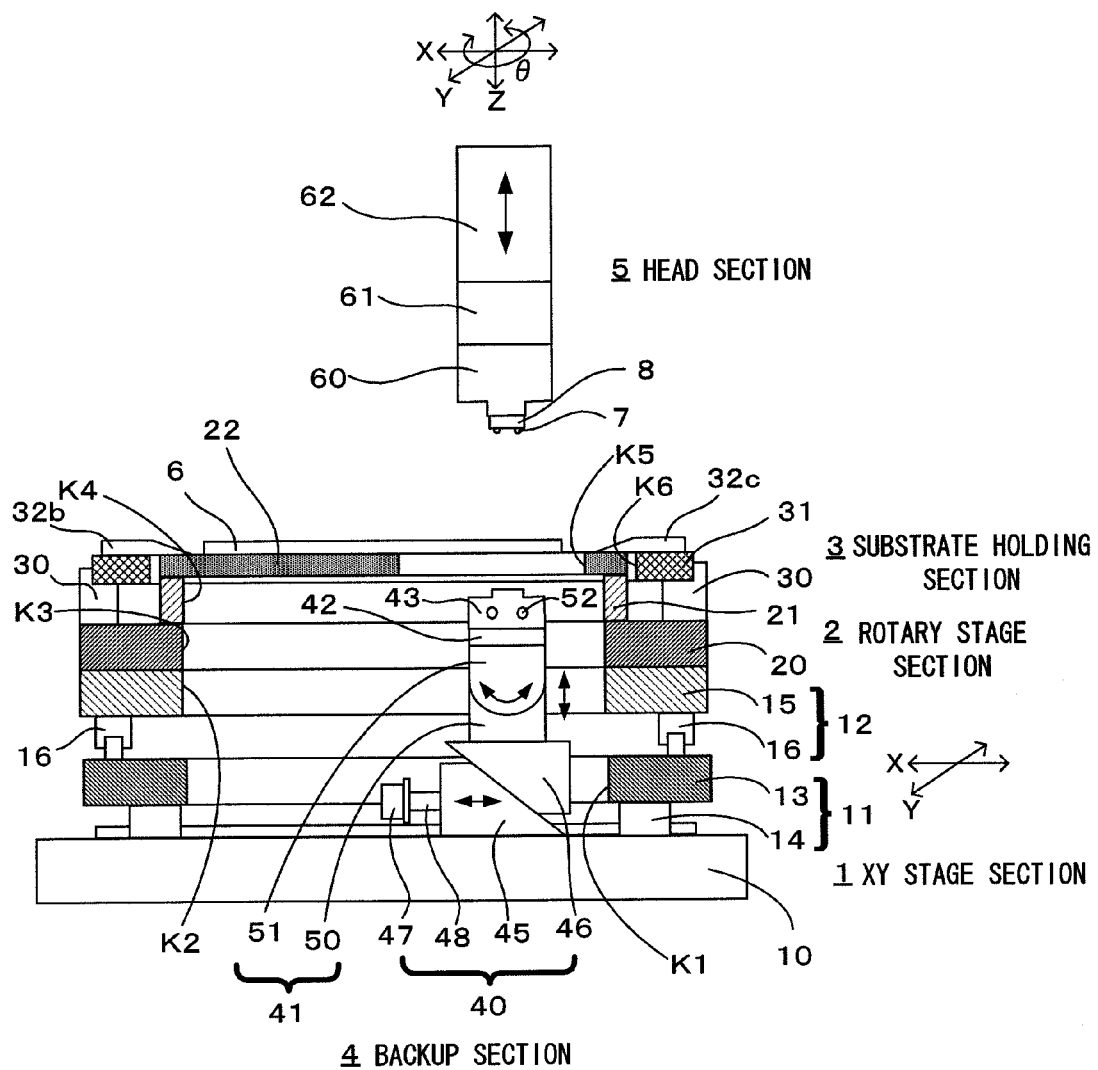
F I G. 1

F I G. 2
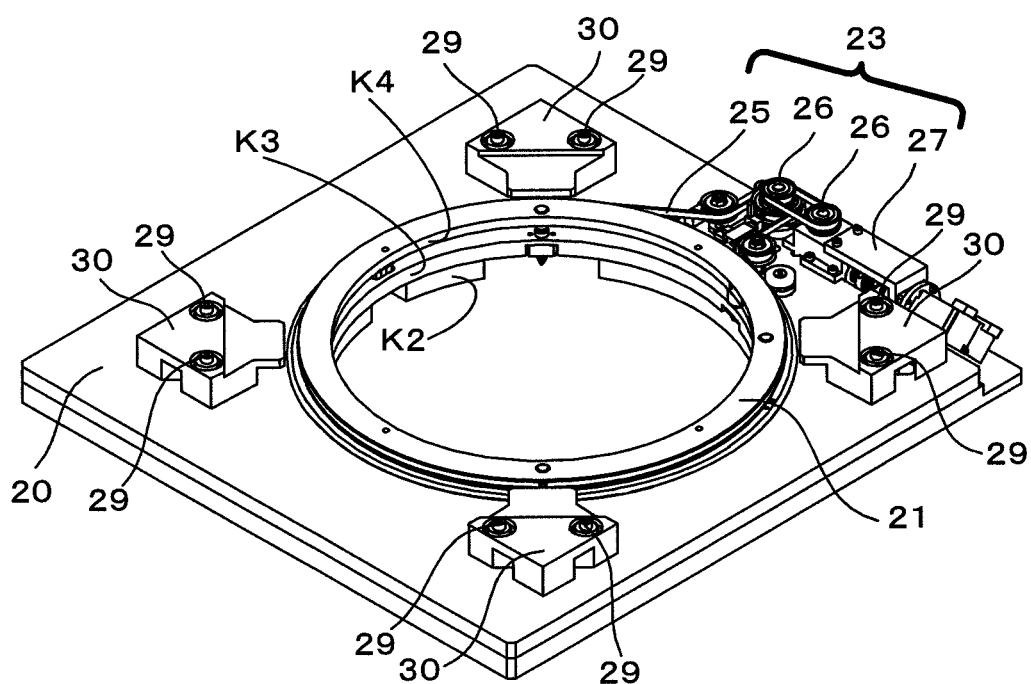

F I G. 4
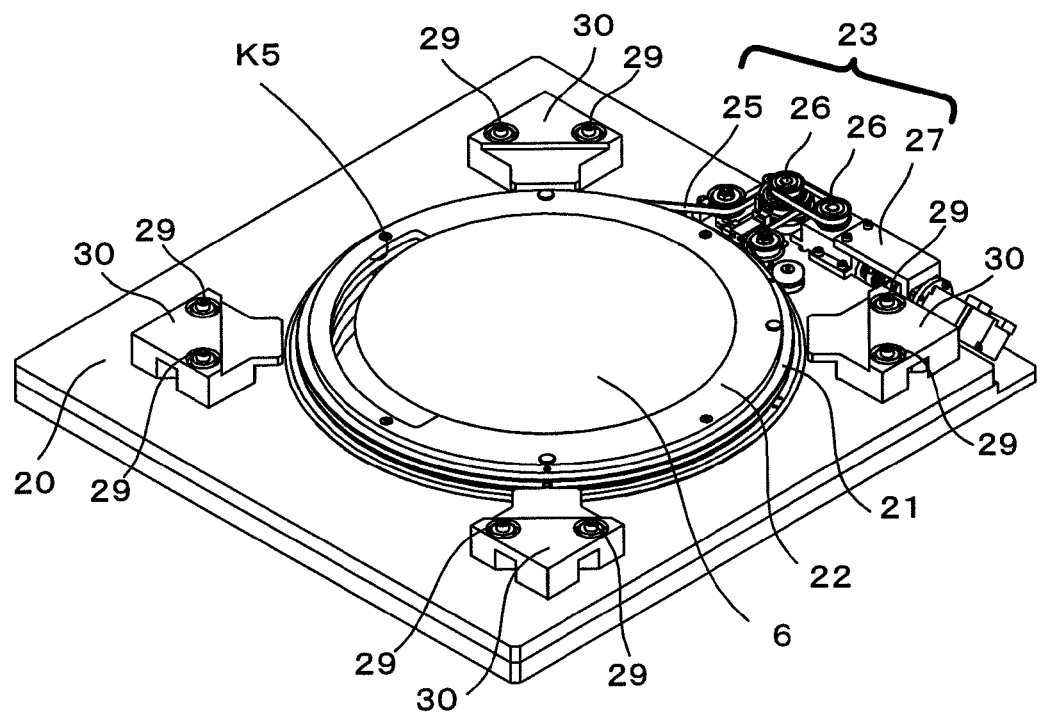

F I G. 8
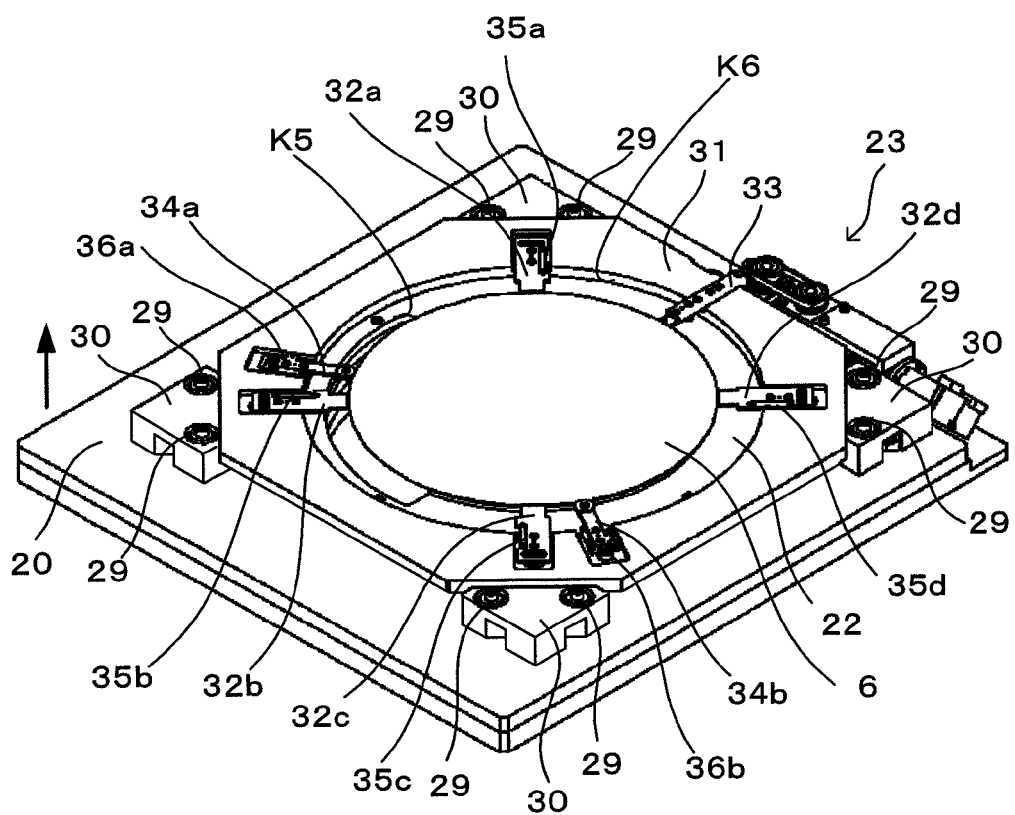

F I G. 1 2
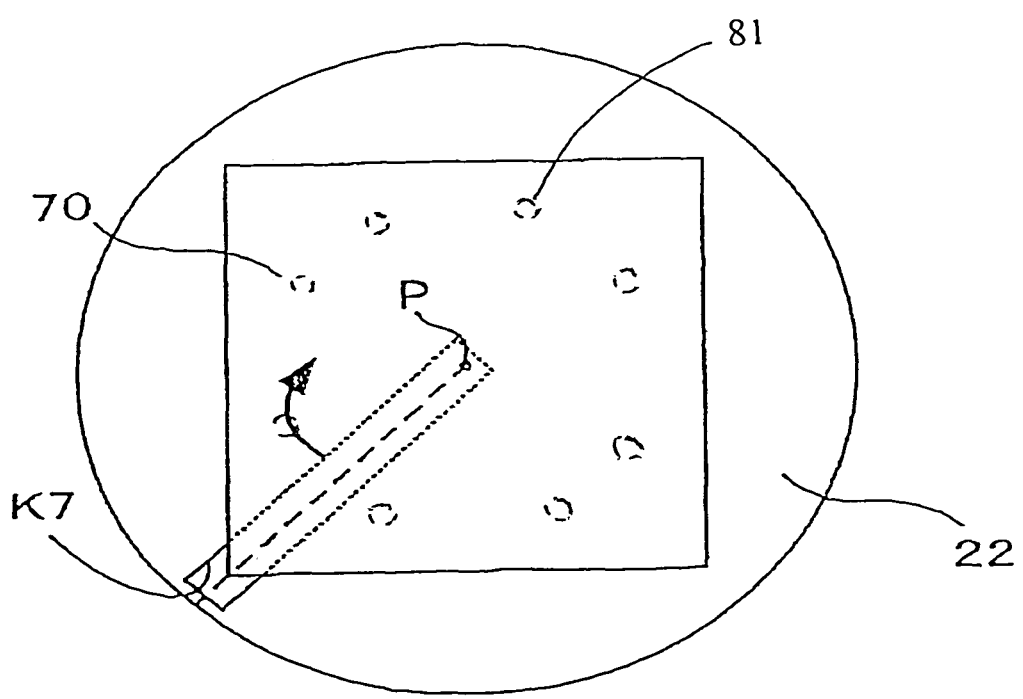

MOUNTING APPARATUS

BACKGROUND OF THE INVENTION

The present invention relates to a mounting apparatus that mounts object-to-be-mounted that has a part such as a semiconductors, a chip and an electronic part, etc., on substrates. Note that the part includes a semiconductor, a chip, an electronic part, a device, etc., and the substrate includes a circuit board, wafer, etc.

As a method for mounting a chip, a device and a part, etc. on a substrate and/or wafer, etc., there is a method recently that mounts the object-to-be-mounted on the upper surfaces of a substrate after arranging locations of the substrate and the object-to-be-mounted by transferring the object, such as a chip, to a specified location of the substrate.

For example, the flip-chip mounting apparatus described in Patent Document 1 comprises a bonding head, which suction-holds a chip, a bonding stage, which suction-holds a substrate, a two sights camera, which arranges locations of a chip and a substrate, and a control device.

After arranging the location of the chip, which are suction-held on the bonding head, and a substrate, which are suction-held on the bonding stage, the height of the bonding stage is adjusted so that the chip contact the substrate, and the chip are placed on the specified location of the substrate. Then the chip is mounted on the substrate while the chip and the substrate are being heated and pressed.

Related Art is Patent Document 1: JP No. 2007-12802, (Paragraph 0019, 0030-0032, FIG. 1)

SUMMARY OF THE INVENTION

But, because production techniques of substrate have been improved, recently the area of produced substrate and wafer has been increased, and a part, etc. is built in to the substrate to save production cost, etc. Additionally, a device production method is being employed to simplify production process, in which a device substrate is formed by slicing a substrate and/or wafer after forming the device on the entire surface of the substrate and/or the wafer. Accordingly, because it is increasingly necessary to mount a part such as a chip on a large substrate and/or wafer, more than before, the bonding area on each substrate and/or wafer is being increased.

But, in the case that, for instance, parts are mounted on a large substrate using heat-hardened resin with a device that heats up the entire substrate, the large substrate is heated for a long time, until the parts are mounted on the entire bonding area of the large substrate. Because of the reason described above, the heat-hardened resin hardens before the parts are mounted on the large substrate caused by prolonged overheating of the large substrate, and there is a possibility that the parts may not be mounted on the large substrate.

Also, when the area of the substrate and/or wafer is increased, there is a possibility that warps and/or flexures may form that are caused by their own weights and/or atmospheric conditions such as heat. In a case like this, if we try to mount parts (such as chips) on a large substrate utilizing the device described in Patent Document 1, it is not possible to mount parts on a large substrate accurately, and the reliability of the device may suffer.

Moreover, in the case that the directions and the mounting locations of the chips, etc. to be mounted have been designed in advance to increase the bonding area on a substrate and/or wafer, a technique was needed to mount the chips, etc. effectively with high density on wide range as designed.

The purpose of the present invention is to provide a mounting apparatus that can mount a part such as a chip on a substrate effectively and precisely.

To solve the problem described above, the mounting apparatus according to the present invention is distinctive in that it comprises a holding pedestal which has an opening section on a portion of the holding pedestal, and the substrate being placed on at least a portion of an peripheral of the opening section of the upper surface of the holding pedestal, holding means that holds the substrate so that the holding pedestal can be moved relative to the substrate, and moving means that moves the holding pedestal so that the opening section is moved relative to the substrate under the condition that the substrate is being held by the holding means, and the opening section is moved so that the area of the track of the opening section becomes larger than the area of the substrate at a place where the substrate is included.

Additionally, the holding means of the mounting apparatus is distinctive in that it comprises a plurality of retainers, which can freely retain and release a plurality of portions of the periphery of the substrate, and lifting/lowering means that lifts and lowers each of the retainers and/or the holding pedestal, and according to another aspect of the invention, the holding pedestal can be moved by lifting and lowering each of the retainers and/or the holding pedestal by means of the lifting/lowering means. Additionally, the holding means of the mounting apparatus is distinctive in that it comprises lifting/lowering means, which lifts and lowers the substrate that is placed on the holding pedestal, and, according to another aspect of the invention, the holding pedestal can be moved by lifting the substrate by means of the lifting/lowering means.

Additionally, the mounting apparatus is distinctive in that, according to another aspect of the invention, it also comprises location adjusting means arranging a location detection section that is composed on the substrate to a pre-determined specified location after detecting the location detection section when the substrate is lowered from the place where the substrate was kept lifted from the holding pedestal, and is placed on the holding pedestal by the lifting/lowering means.

Also, according to another aspect of the invention, the opening section of the mounting apparatus is distinctive in that it is composed of a shape that includes the center of the substrate and a portion of the peripheral of the substrate, and the moving means rotates the holding pedestal by a specified angle.

Because the holding pedestal has an opening section, it is possible to process bonding of part, etc. on a local region of a substrate from the lower surface of the substrate at the opening section. Also, because the opening section of the holding pedestal moves relative to the substrate, it is possible to mount part, etc. on the substrate at the opening section without changing the direction of the substrate. Accordingly, because it is not necessary to change the direction of the part, etc. to match the substrate, the part, etc. can be easily mounted on the substrate.

Additionally, the substrate is placed on at least a portion of the peripheral of the opening section, and because the opening section moves so that the area of the track of the opening section is larger than the area of the substrate at a place where the substrate is included, it is possible to mount part, etc. up to the edge of the substrate. Accordingly, it is possible to mount part, etc. on a wide range of the entire substrate, and the bonding area can be increased.

According to the second aspect of the invention, the substrate can be lifted from the holding pedestal together with the retainers, while the substrate is being held by the retainers that are provided at a plurality of portions of the peripheral of the substrate. Accordingly, when the holding pedestal is moved relative to the substrate, it is possible to prevent damage to the substrate that is caused by friction, etc. between the substrate and the holding pedestal.

According to the third aspect of the invention, because the substrate itself can be lifted up from the holding pedestal and lowered, the holding pedestal can be moved relative to the substrate while the substrate is being lifted up from the holding pedestal and held. Accordingly, when the holding pedestal is moved relative to the substrate, it is possible to prevent damage to the substrate that is caused by friction, etc. between the substrate and the holding pedestal.

According to the fourth aspect of the invention, when the substrate, which was being lifted up from the holding pedestal, is placed on the upper surface of the holding pedestal again, the location of the substrate can be adjusted to a specified location. Accordingly, before the substrate is lifted up from the holding pedestal and after the substrate is lowered to the holding pedestal, the direction and location of the substrate can be adjusted to a specified direction and location respectively.

According to the fifth aspect of the invention, because the shape of the opening section includes the center and a portion of the peripheral of the substrate, part, etc. can be mounted on the entire substrate by rotating the holding pedestal. Also, because the holding pedestal rotates, a moving means, which moves the holding pedestal, can be such that moves the holding pedestal only in one direction (the direction of rotation), and the configuration of the device can be simplified and/or smaller.

BRIEF DESCRIPTION OF DRAWINGS

FIG. 1 is a schematic diagram illustrating a configuration of a mounting apparatus according to the present embodiment;

FIG. 2 is an exploded perspective view illustrating a disassembled rotary stage section according to the present embodiment;

FIG. 4 is a perspective view illustrating a wafer placed on the rotary stage section shown in FIG. 3;

FIG. 8 is a schematic diagram illustrating the movement of the rotary stage section of the mounting apparatus according to the present invention;

FIG. 12 is a partial schematic diagram illustrating a configuration of a sample of changes of an opening section of a turntable according to the present invention;

DETAILED DESCRIPTION OF THE INVENTION

Figure 3:
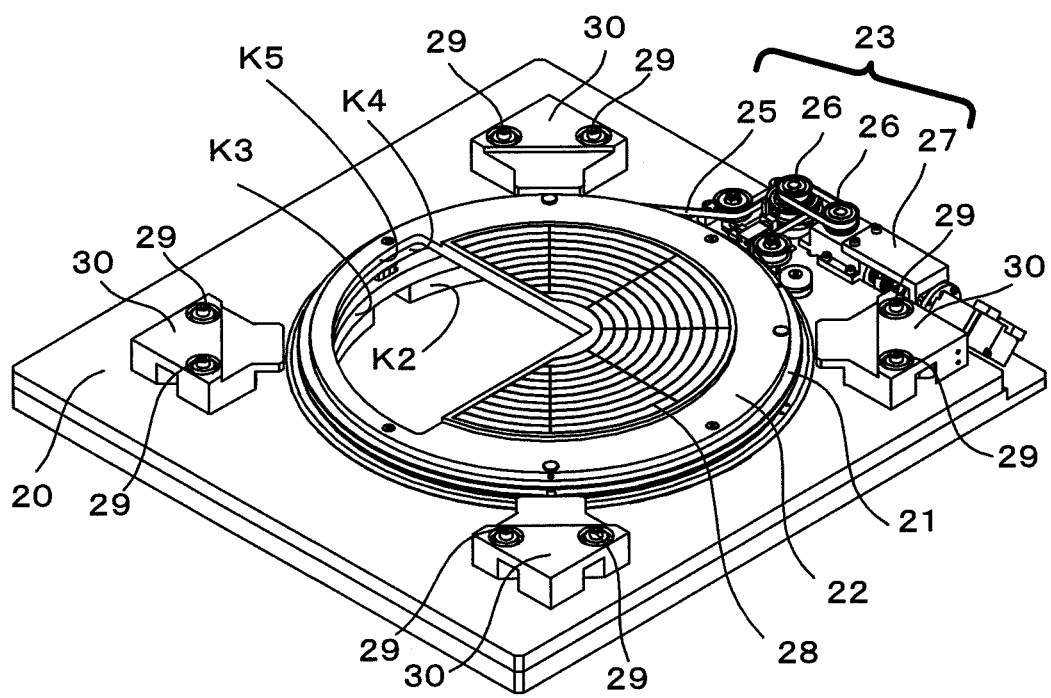
FIG. 3 is an exploded perspective view illustrating a disassembled rotary stage section according to the present embodiment.
Figure 5:
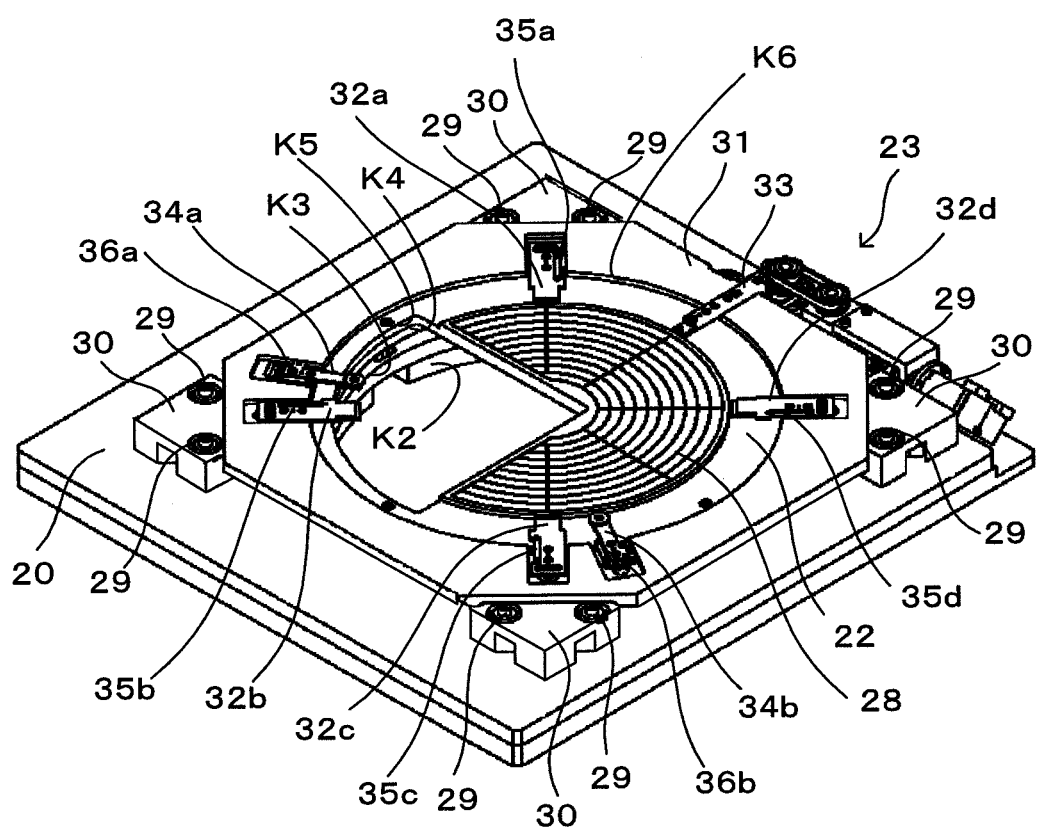
FIG. 5 is a schematic diagram illustrating the rotary stage section of the mounting apparatus according to the present embodiment.

An embodiment of a mounting apparatus according to the present invention will be described referring to FIG. 1 to FIG. 13B. FIG. 1 is a schematic diagram illustrating an embodiment of a mounting apparatus according to the present invention. FIG. 2 and FIG. 3 are exploded perspective views illustrating a disassembled rotary stage section. FIG. 4 is a perspective view illustrating a wafer, which is a substrate, on which object-to-be-mounted having a part such as semiconductor, chip, electronic part, etc., is mounted, and is placed on the rotary stage section shown in FIG. 3. FIG. 5 is a perspective view illustrating the rotary stage section and a holding table. FIGS. 6 to 11 are schematic diagrams illustrating movement of the rotary stage section of the mounting apparatus. FIGS. 12 to 13B are diagrams illustrating samples of changes which show the relation of locations between the substrate and the opening section.

Regarding the present embodiment, a mounting apparatus will be described that uses heat to bond a chip 8 which have melting metal bumps 7 on wafer 6 after they are placed facing each other.

(Configuration of Apparatus)

The mounting apparatus according to the present embodiment comprises XY stage section 1, rotary stage section 2, which is placed on the upper surface of XY stage section 1, substrate holding section 3, backup section 4, and head section 5.

XY stage section 1, as shown in FIG. 1, is composed of X transfer mechanism 11 on the upper surface of base pedestal 10, and also Y transfer mechanism 12 on X transfer mechanism 11.

X transfer mechanism 11 comprises X table 13, which has opening section K1, and drive sections (no fig.), which are composed of X guide 14 and shaft motors, and the drive sections, which comprise X guides 14 and the shaft motors, are placed on both sides of direction Y and between the upper surface of base pedestal 10 and the bottom surface of X table 13, pinching opening section K1. When the shaft motors on the drive sections are magnetized and activated, it is configured such that X table 13 moves to the direction (X) guided by X guide 14.

Additionally, Y transfer mechanism 12 comprises Y table 15, which has opening section K2, the shape of which is almost the same as opening section K1, and drive sections (no fig.), which are composed of Y guide 16 and shaft motors, and the drive sections, which are composed of Y guide 16 and shaft motors, are placed on both sides of direction X and between the upper surface of X table 13 and the bottom surface of Y table 15, pinching opening sections K1 and K2. When the shaft motors on the drive sections are magnetized and activated, Y table 15 moves to the direction (Y) guided by Y guide 16.

Accordingly, it is configured such that X table 13, which is composed on X transfer mechanism 11, and Y table 15, which is composed on Y transfer mechanism 12, can move in a direction perpendicular to each other, and XY stage section 1 moves rotary stage section 2, which is composed on the upper surface of XY stage section 1, to direction X and direction Y.

Rotary stage section 2 comprises base pedestal 20, which is almost a square shape and has opening section K3 of a circular shape, turn-pedestal 21, turntable 22, and rotary drive mechanism 23.

Base pedestal 20 is placed on the upper surface of XY stage section 1 so that the opening section K3 is located above opening section K2. Also, on the upper surface of base pedestal 20, as shown in FIG. 2, turn-pedestal 21, which has opening section K4, is composed so that it can be moved and placed so that it surrounds opening section K3, and it is configured so that turn-pedestal 21 is rotated along the peripheral of opening section K3 by rotary drive mechanism 23.

Rotary drive mechanism 23, as shown in FIG. 2, comprises timing belt 25, roller 26 and rotary drive section 27, which is driven by a servomotor, and timing belt 25 is placed so that it surrounds the peripheral of turn pedestal 21. When rotary drive section 27 is activated by magnetizing the servomotor, the rotation of rotary drive section 27 is transferred to roller 26 so that they rotate. Timing belt 25 is driven by the rotation of roller 26, and turn-pedestal 21 rotates.

Also, on the upper surface of turn-pedestal 21, as shown in FIG. 3, turntable 22 is installed and composed to rotate together with turn-pedestal 21.

A portion of the upper surface of turntable 22, where wafer 6 is placed, has a circular shape with a diameter almost equal to the maximum diameter of wafer 6, which can be placed, and opening section K5, which has a fan shape with a central angle of 90 degrees so that it includes the center point of the upper surface, is composed. Also, as shown in FIG. 4, opening section K5 is composed to be a fan shape and to have a radius larger than that of wafer 6 so that a portion of wafer 6 is placed above opening section K5 when wafer 6 is placed on the upper surface of turntable 22. Accordingly, the track, which is traced by the rotation of opening section K5, is circular and the area is larger than the circular shape of the portion of turntable 22 where wafer 6 is placed.

Also, on the upper surface of turntable 22, as shown in FIG. 3, suction grooves 28, which are used to hold wafer 6 by vacuum-suction, are composed, and the suction grooves 28 are connected to the vacuum-suction means of vacuum pumps, etc., a figure of which is omitted. Also, a heater (no fig.) is built in turntable 22 and it is composed to pre-heat wafer 6. Note that turntable 22 corresponds to a holding pedestal according to the present invention, and rotary drive mechanism 23 corresponds to a moving means according to the present invention.

Substrate holding section 3, as show in FIG. 2 to FIG. 6, comprises lift cylinder 29, lift table 30, and holding table 31, and lift table 30, which comprises lift cylinder 29, is placed on the upper surface of base pedestal 20, and on the upper surface of lift table 30, as show in FIG. 5, holding table 31 is composed.

Holding table 31 is octagonal in shape and is composed by cutting 4 corners, and is almost square and smaller than base section 20. On holding table 31, the circular-shaped opening section K6, whose radius is larger than that of the portion of upper surface of turntable 22, where wafer 6 is placed, is composed, and as shown in FIG. 5, turntable 22 is configured so that it is placed on the location of opening section K6. Note that substrate holding section 3 corresponds to a holding means according to the present invention.

Additionally, holding table 31 comprises lift arms 32a, 32b, 32c, 32d, which shuttle back and forth toward the center of opening section K6 at the specified locations on the upper surface around the peripheral of opening section K6, as well as notch-pin cylinder 33, and roller cylinders 34a and 34b.

Lift arms 32a, 32b, 32c and 32d each comprise spring mechanism 35a, 35b, 35c and 35d and air cylinders (no fig.), and when air is supplied to the air cylinders, lift arms 32a, 32b, 32c and 32d are pushed out toward the direction of the center of opening section K6 of holding table 31 against the spring forces of spring mechanism 35a, 35b, 35c and 35d, and when the air supply to air cylinders is stopped, lift arms 32a, 32b, 32c and 32d are pushed back and returned to the specified locations by the spring forces of spring mechanism 35a, 35b, 35c and 35d. Also, because wafer 6 is placed on the upper surfaces of lift arms 32a, 32b, 32c and 32d, lift arms 32a, 32b, 32c, and 32d are composed to be tapered so that their tip portions toward the center of opening section K6 become gradually thinner, so that they can be easily inserted into the bottom surface of wafer 6. Note that lift arms 32a, 32b, 32c and 32d correspond to retainers according to the present invention.

Also, Notch-pin cylinder 33, which has a convex-shaped notch, comprises a spring mechanism and an air cylinder, figures of which are omitted, and roller cylinders 34a and 34b each comprise spring mechanism 36a and 36b respectively, and air cylinders (no fig.). Additionally, as with the aforementioned lift arms 32a, 32b, 32c, and 32d, they are composed so that they can go in and out toward the center of opening section K6, and when wafer 6 is placed on the upper surface of turntable 22, wafer 6 is moved slightly to adjust the location so that the notch-pin of notch-pin cylinder 33 is engaged with a V-shaped ditch, which is pre-composed on a portion of the peripheral of wafer 6, by roller cylinders 34a and 34b, and then the location of wafer 6 is decided. Accordingly, notch-pin cylinder 33 and roller cylinders 34a and 34b correspond to the location adjusting means according to the present invention. Note that, notch-pin cylinder 33 and roller cylinders 34a and 34b may be used as guides to keep the location of wafer 6 at a specified location when turntable 22 is being rotated.

Also, lift cylinders 29 are configured so that they use supplied air to expand and contract, thereby lifting table 30 and holding table 31, which is composed on lift table 30, up and down. Accordingly, lift cylinders 29 and lift tables 30 correspond to lifting/lowering means according to the present invention.

Backup section 4, as shown in FIG. 1, comprises lifting mechanism 40, plane adjusting mechanism 41, insulator 42, and holding pedestal 43.

As shown in FIG. 1, lifting mechanism 40 comprises lower lift cam 45 and upper lift cam 46 on base pedestal 10. Lower lift cam 45 comprises drive motor 47, which is composed of a servomotor, and ball screw 48, and when drive motor 47 is magnetized and activated, the rotations of drive motor 47 are transferred to ball screw 48, which then rotates. Next, lower lift cam 45 moves horizontally along ball screw 48 (in the direction of the arrow in FIG. 1, parallel to direction X).

Additionally, upper lift cam 46, which is guided so that it moves only vertically along a guide (no fig.), is pushed up smoothly by lower lift cam 45 along inclinations composed on lower lift cam 45 and upper lift cam 46, and plane adjusting mechanism 41, insulator 42, and holding pedestal 43, which are composed on the upper surface of upper lift cam 46, are lifted up along the guide. Also, by reversing the direction of the electric current that is applied to drive motor 47, the rotation of drive motor 47 is reversed, and plane adjusting mechanism 41, insulator 42, and holding pedestal 43, which are composed on the upper surface of upper lift cam 46, are lifted down.

Also, plane adjusting mechanism 41 is composed of receiving section 50 and accord section 51, and the inclination of the upper surface of holding pedestal 43 is adjusted in copying manner while the upper surface of receiving section 50 and the lower surface of accord section 51 are being slid.

Moreover, on the upper surface of accord section 51, holding pedestal 43, which comprises heater 52 inside, is composed via insulator 42, and it is composed so that holding pedestal 43 heats up wafer 6, which is placed on the upper surface of holding pedestal 43. Also, backup section 4 is configured so that it can be moved to a specified location of opening section K5 by moving XY stage section 1, and it can be moved relative to wafer 6 in three dimensions, and it is configured so that wafer 6, which is placed on the upper surface of turntable 22, can be heated to the peripheral edge of it without interfering with other components.

Head section 5 comprises holding section 60, which holds an object-to-be-mounted, horizontal moving mechanism 61, which moves head section 5 horizontally (directions X, Y, and θ), and vertical moving section 62, which moves head section 5 vertically (Z direction).

On the bottom surface of holding section 60, a suction mechanism (no fig.) that holds a chip 8, which is the object-to-be-mounted, is composed and a chip 8 are held by vacuum-suction. Note that the method to hold the object-to-be-mounted is not limited to vacuum-suction; mechanical holding and/or other methods of holding may be used.

Note that head section 5 may be additionally composed of a plane adjusting mechanism and a heating mechanism such as a heater, etc.

(Bonding Process)

Next, a process of the present mounting apparatus will be described. Regarding the present embodiment, a bonding process will be described in which a chip 8, which have melting metal bump 7, are laid on wafer 6 and is bonded by heating.

First, the upper surface of holding pedestal 43 of backup section 4 is adjusted in copying manner. With the condition that the lock of horizontal adjusting mechanism 41 of backup section 4 is released, backup section 4 is lifted up by lifting mechanism 40 at each opening section K1 through K5, and head section 5 is lifted down by vertical moving mechanism 62 of head section 5. The slope of the plane of the upper surface of holding pedestal 40 is adjusted in accordance with the slope of the plane of the bottom surface of holding section 60, and under this condition, horizontal adjusting mechanism 41 is locked and the plane is fixed at a specified slope. Note that at the time, holding mechanism 60 of head section 5 may be composed of a standard accord body, which has a standard surface for copying the slope of the plane, and additionally, the bottom surface of holding section 60 may be a standard surface for copying the slope of the plane.

Additionally, head section 5 is lifted up by vertical moving mechanism 62 at each opening section K1 through K5, backup section 4 is lifted down by lifting mechanism 40, and the accord-adjusting is completed.

Figure 6:
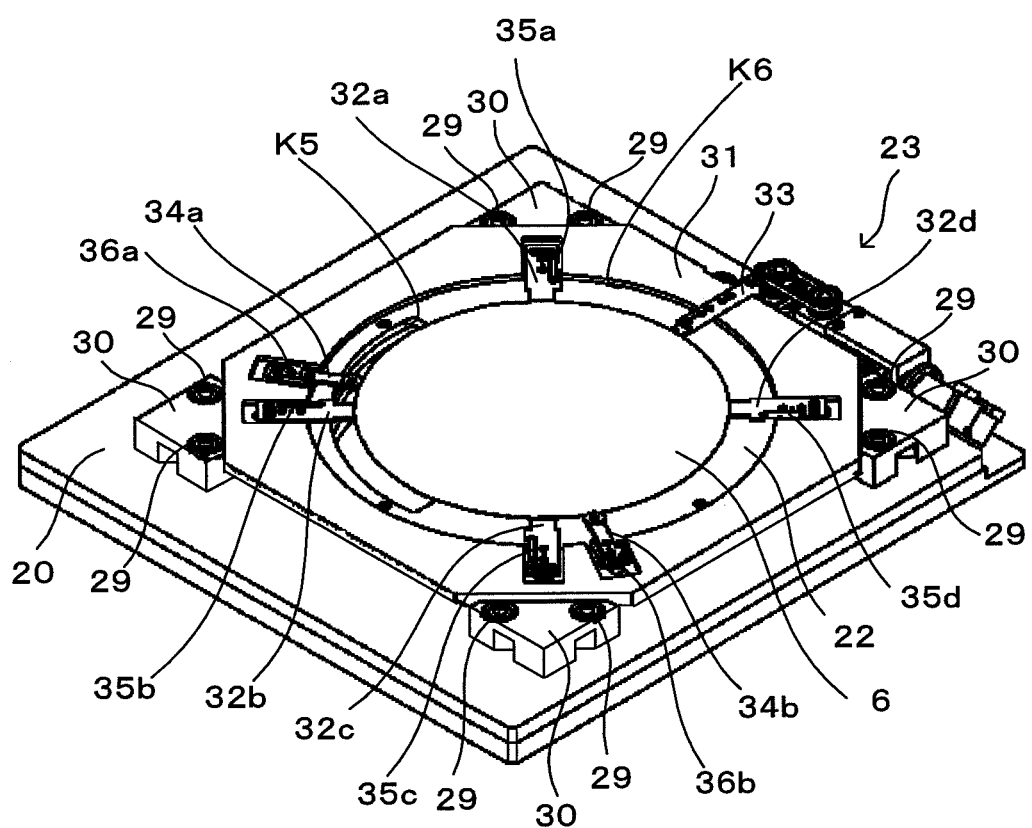
FIG. 6 is a schematic diagram illustrating the movement of the rotary stage section of the mounting apparatus according to the present invention.

Next, Wafer 6 is placed on the upper surface of rotary table 22. As shown in FIG. 6, wafer 6 is placed on the upper surface of rotary table 22 so that it covers a portion of opening section K5 by a substrate transfer device (no fig.). To engage a V-shaped groove (which is composed on wafer 6) with notch-pin cylinder 33, the location of wafer 6 is adjusted by roller cylinder 34a and 34b, which are being pressed on wafer 6. Wafer 6 is held by vacuum-suction on the upper surface of turntable 22. After that, roller cylinder 34a and 34b are retracted to specified locations. Note that it is acceptable that roller cylinder 34a and 34b are not retracted after wafer 6 has been suction-held on the upper surface of stage 1.

Additionally, the location adjustment that makes a specified location of wafer 6 be matched with a specified location on the upper surface of holding pedestal 43 of backup section 4 is conducted by moving XY stage section 1. Note that it is acceptable that after wafer 6 is placed on the upper surface of turntable 22, wafer 6 is pinched and held by the upper surface of holding pedestal 43 and the bottom surface of holding section 60, and then the plane adjustment of the upper surface of holding pedestal 43 is conducted by plane adjusting mechanism 41.

Also, the chip 8 is suction-held on holding section 60 of head section 5.

Figure 7:
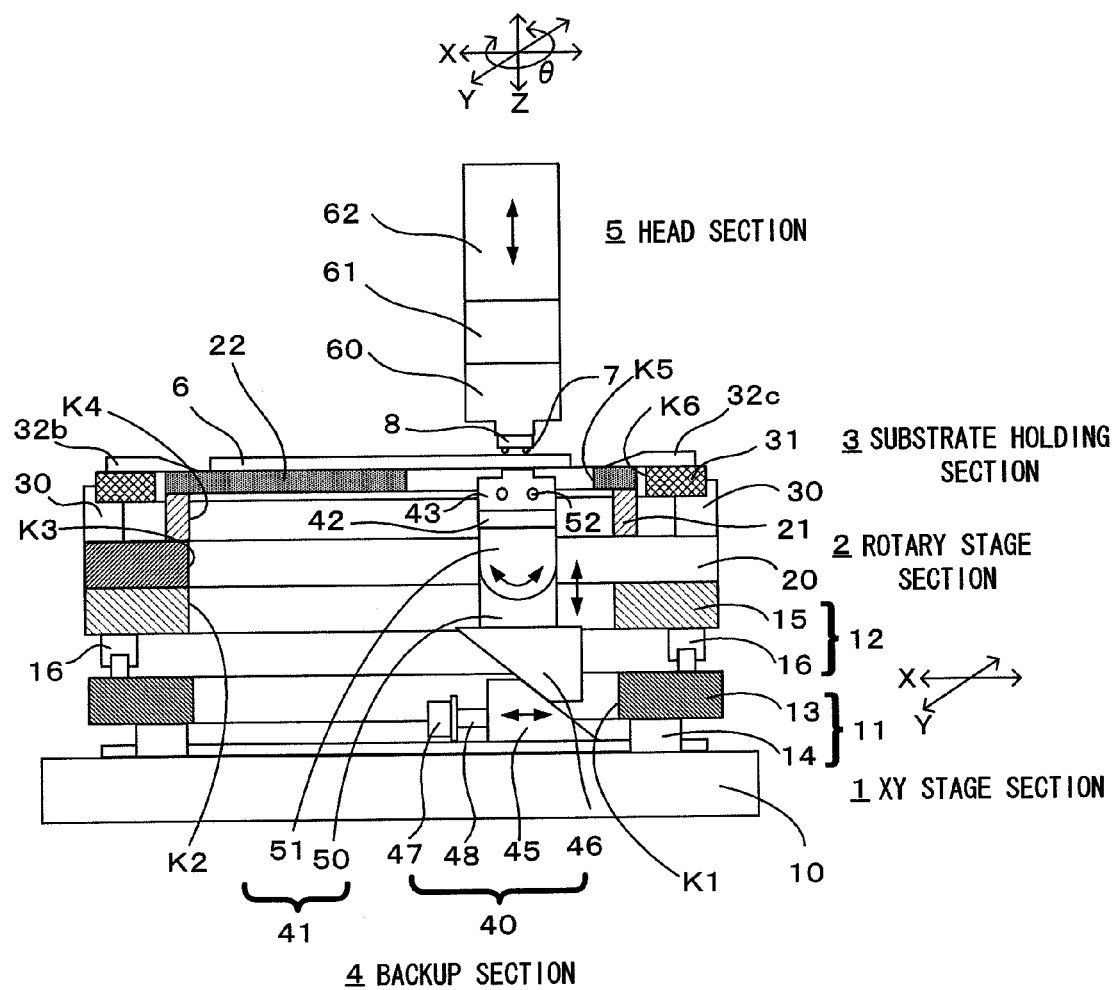
FIG. 7 is a schematic diagram illustrating the movement of the rotary stage section of the mounting apparatus according to the present invention.

Next, chip 8 and wafer 6 are bonded while they are being pinched and held by head section 5 and backup section 4. As shown in FIG. 7, head section 5, which holds the chip 8, is moved down again by vertical moving mechanism 62, and backup section 4 is lifted up by lifting mechanism 40. Chip 8 and wafer 6 are placed facing each other, and they are pinched and held by head section 5 and backup section 4. Because holding pedestal 43 of backup section 4 is equipped with heater 52, heater 52 heats the portion of wafer 6 where the upper surface of holding pedestal 43 is contacted. Accordingly, if wafer 6 and chip 8 are held for a specified time under this condition, melting metal bump 7, which is contacted with wafer 6 and placed and held on wafer 6, are heated up and melted. Note that it is acceptable that the heater is composed on holding section 60 of head section 5, and also that wafer 6 and chip 8 are heated by head section 5. Also, at this time, it is better that wafer 6 is pre-heated by the heater built in turntable 22.

After that, the suction-holding of holding section 60 of head section 5 is released, head section 5 and backup section 4 are restored after each of them is lifted up and down respectively, and the bonding of wafer 6 and chip 8 is completed.

After moving and restoring head section 5 and backup section 4, wafer 6 is moved by XY stage section 1 so that the next portion of wafer 6 to be bonded is placed above holding pedestal 43. Also, new chip 8 is suction-held on holding section 60 of head section 5. Then, the aforementioned processes are repeated by head section 5 and backup section 4, and multiple chips 8 are bonded on wafer 6.

Additionally, after a specified number of chip 8 have been bonded on wafer 6 at opening section K5, the vacuum-suction of wafer 6 on turntable 22 is released. Then, as shown in FIG. 8, lift arms 32a, 32b, 32c and 32d are inserted between the bottom surface of wafer 6 and the upper surface of turntable 22, and holding table 31 composed on the upper surface of lift table 30, lift arms 32a, 32b, 32c and 32d, and wafer 6 are lifted up by lift cylinders 29. Note that although the lifted distance of wafer 6 is about 5 mm at this time according to the present embodiment, the point is that any distance is acceptable if the distance is kept so that wafer 6 does not contact the upper surface of turntable 22.

Figure 9:
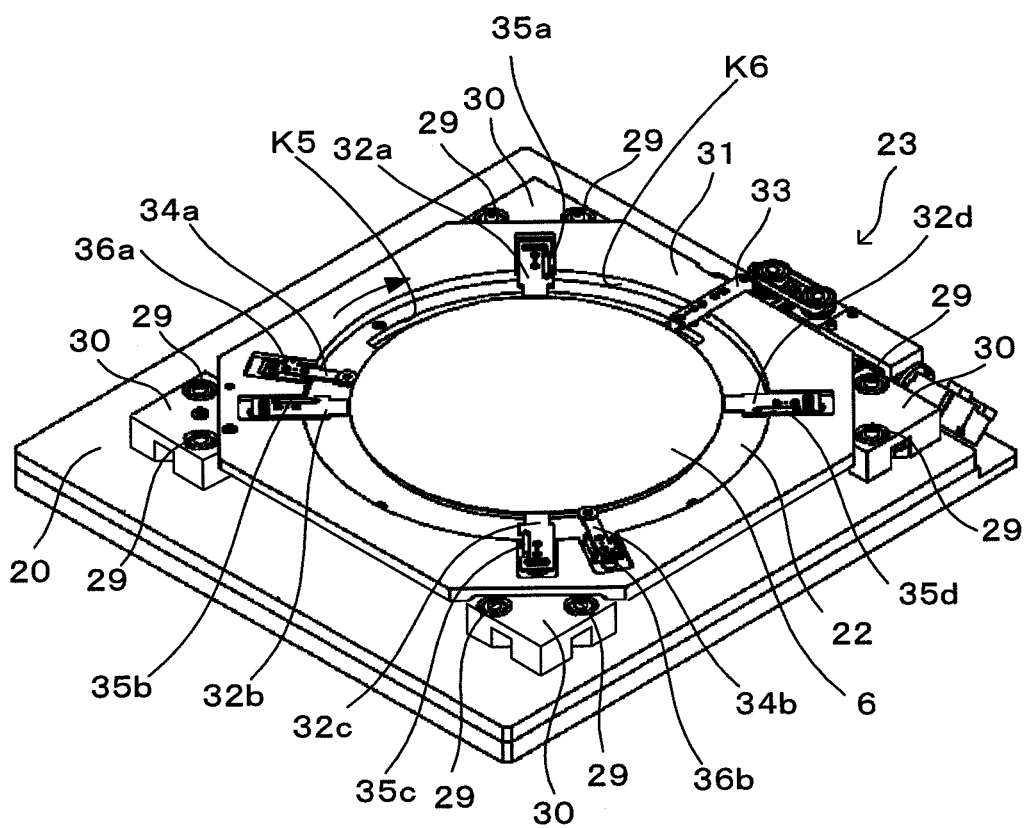
FIG. 9 is a schematic diagram illustrating the movement of the rotary stage section of the mounting apparatus according to the present invention.

Then, as shown in FIG. 9, turntable 22 together with rotary pedestal 21 is rotated 90 degrees toward the rotating direction (the direction of the arrow in FIG. 9) of turntable 22.

Figure 10:
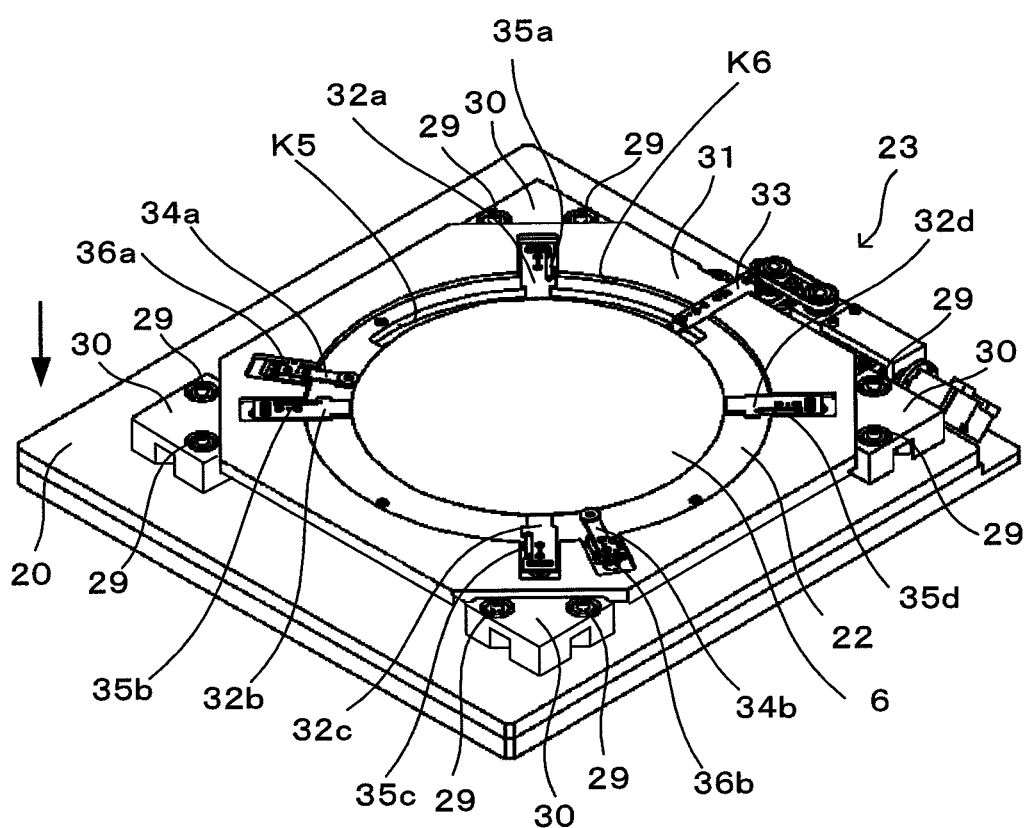
FIG. 10 is a schematic diagram illustrating the movement of the rotary stage section of the mounting apparatus according to the present invention.
Figure 11:
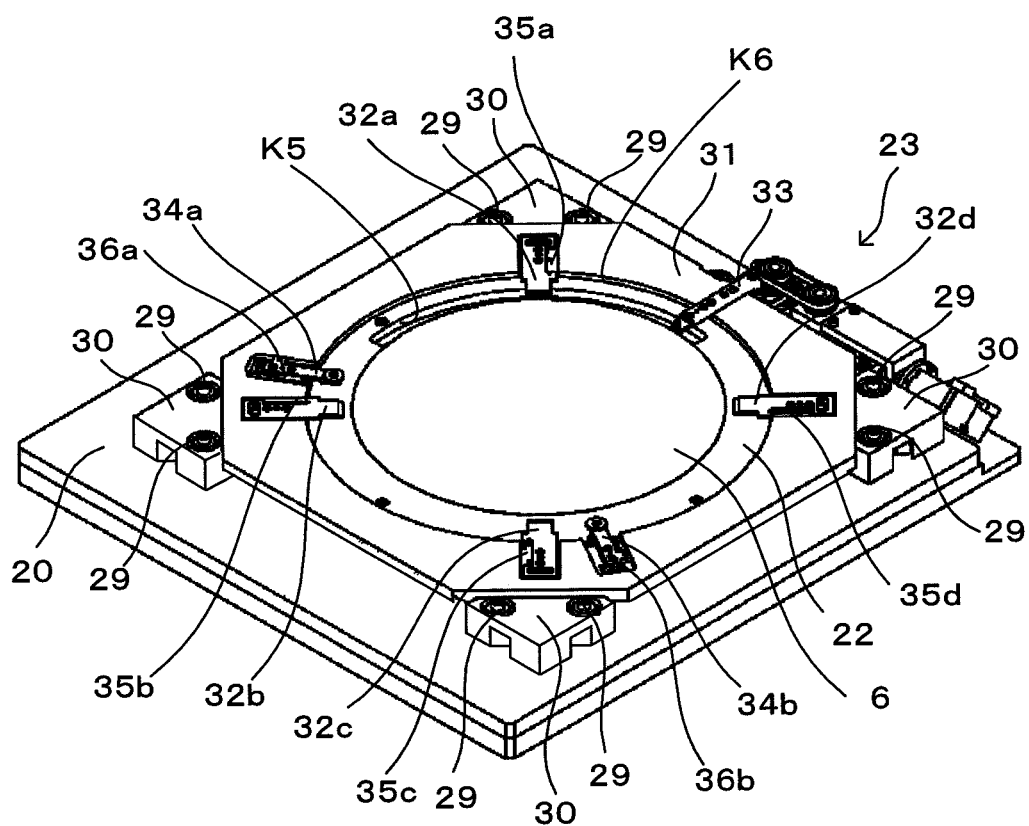
FIG. 11 is a schematic diagram illustrating the movement of the rotary stage section of the mounting apparatus according to the present invention.

After that, as shown in FIG. 10, holding table 31, which is composed on the upper surface of lift table 30, lift arms 32a, 32b, 32c and 32d, and wafer 6 are lifted down by lift cylinders 29, then lift arms 32a, 32b, 32c and 32d are removed from the space between the bottom surface of wafer 6 and the upper surface of turntable 22. Wafer 6 is pushed by roller cylinder 34a and 34b, and the location of wafer 6 is adjusted so that the location detection section, which is composed on wafer 6 with a V-shaped ditch, is placed and engaged with notch-pin cylinder 33, then wafer 6 is suction-held on the upper surface of turntable 22 again. After that, as shown in FIG. 11, notch-pin cylinder 33 and roller cylinder 34a and 34b are removed, and the placement of wafer 6 is completed.

Then, when chip 8 have been bonded on the entire surface of wafer 6 after the aforementioned bonding process and the rotation of turntable 22 were repeated, the object-to-be-mounted (wafer 6 and multiple chips 8), the bonding process of which have been completed, are pulled out, and the series of bonding process is completed.

According to the present embodiment, because opening section K5 of turntable 22 is rotated relative to wafer 6, chip 8 can be mounted on wafer 6 at opening section K5 without changing the direction of wafer 6. Accordingly, it is not necessary to change the direction of chip 8 so that they are adjusted to that of wafer 6, and chip 8 can be mounted on wafer 6 simply and easily.

Also, because wafer 6 is placed so that it covers a portion of opening section K5, the tracking area of opening section K5, when turntable 22 is rotated one revolution, becomes larger than the area of wafer 6 at the location where wafer 6 is included as described above. Accordingly, because the upper surface of holding pedestal 43 of backup section 4 can also contacts the peripheral of wafer 6, chip 8 can be mounted to the edge of wafer 6. Accordingly, it is possible to mount chip 8 on a wide range of the entire surface of wafer 6 and the bonding area can be increased to the edge of wafer 6.

Also, because only these portions of chip 8 and wafer 6, which are pinched and held by head section 5 and backup section 4, are locally heated, and because heating of the entire surface of wafer 6 does not occur, melting metal bumps 7 of bonded chip 8 are not melted again, and wafer 6 and chip 8 can be bonded with precision. Also, damage to object-to-be-mounted, which may be caused by overheating, can be prevented.

Additionally, because wafer 6 and chip 8 are pinched and held locally by head section 5 and backup section 4 and bonded, even if wafer 6 is warped or distorted, a chip 8 can be bonded on wafer 6 while keeping a specified plane at the portion where the bonding is performed.

(Example of Different Shape)

Note that the shape of opening section K5, which is composed on turntable 22, is not limited to the aforementioned embodiment; any shape is acceptable if substrates, etc. can be placed on at least a place of the peripheral of opening section K5, and opening section K5 can be moved by the movement of turntable 22 so that the tracking area of opening section K5 at a portion where the substrates, etc. are included becomes larger than the area of the substrates, etc. Hereinafter, examples of different shapes of the opening section will be described. Note that the shape of turntable 22 is not limited to be circular; other shapes are acceptable.

As shown in FIG. 12, opening section K7 is composed to be a slit shape so that it includes center P of substrate 70 and a portion of the peripheral of substrate 70 (here, substrate 70 is described as a rectangular shape). Additionally, it is composed such that it is rotated by a specified angle at the place below substrate 70 by the rotation of turntable 22.

Accordingly, because the area of opening section K7 is composed to be small, the area of turntable 22 other than opening section K7 becomes large, and substrate 70, which is placed on the upper surface of turntable 22, can be held more steadily.

Also, the holding pedestal is not limited to be turntable 22, but rather a table that is movable in directions X and Y may be composed. Substrate 70 may be circular in shape. Moreover, the shape of an opening section, which is composed on the holding pedestal, may be any shape as long as the opening section is movable so that the tracking area of the opening section is larger than the area of a substrate, etc. at a location where the substrate, etc. is included. Hereinafter, samples of other shapes of the opening section will be described. Note that because a holding pedestal may be any shape and/or size if it is composed with a shape and/or size which can hold substrates steadily, the description of the holding pedestal is omitted and the relation of locations between a substrate and an opening section will be described.

Figure 13A:
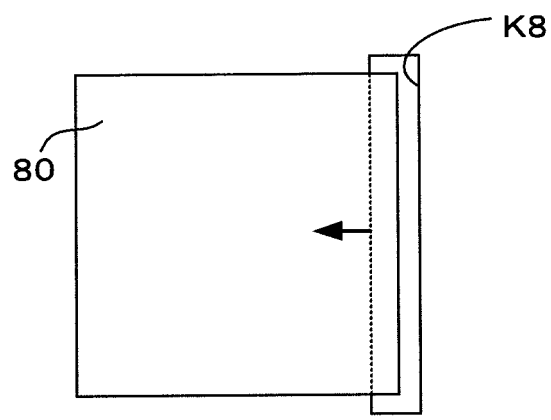
FIGS. 13A and 13B are partial schematic diagrams illustrating a configuration of a sample of changes of an opening section of a turntable according to the present invention.
Figure 13B:
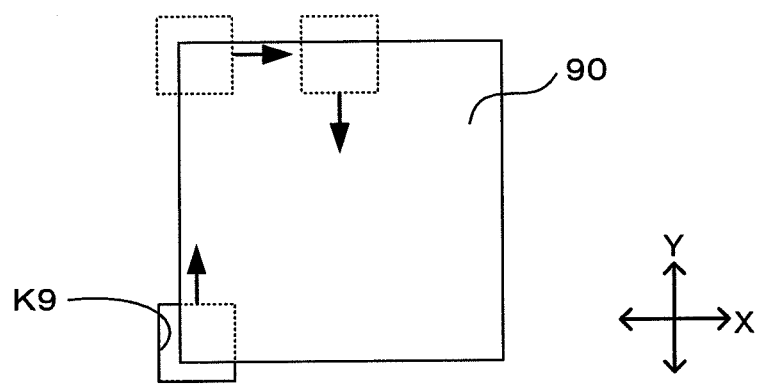

In a sample of a different shape shown in FIG. 13A, opening section K8 is composed as a slit shape that includes both edges of substrate 80 and also to be movable in one direction. Also, in a sample of a different shape shown in the FIG. 13B, opening section K9 is composed to be much smaller, and it is composed so that it can be moved to a specified location in direction X and direction Y of substrate 90 in sequence. Note that the size of the opening section is acceptable if it is composed to be larger than holding pedestal 43 of backup section 4.

Additionally, the present invention is not limited to be the aforementioned embodiments, but it is possible to make various changes other than those described above, so long as such changes or modifications do not deviate from the scope of the invention.

As a sample, although the aforementioned embodiment lifts and lowers wafer 6 utilizing substrate holding section 3, the lifting/lowering and rotation of wafer 6 may be conducted by air. For example, air-jet nozzles 81 are composed on turntable 22 as shown in FIG. 12, and after wafer 6 is blown up by air from the air-jet nozzles 81, turntable 22 is rotated. In this case, notch-pin cylinder 33 and roller cylinder 34a and 34b may be used as guides to hold wafer 6 at a specified location.

Also, in the embodiment described above, holding table 31, which is composed on the upper surface of lift table 30, and lift arms 32a, 32b, 32c, and 32d are composed to be lifted up, but it is acceptable to configure so that only lift arms 32a, 32b, 32c, and 32d are lifted up and down.

Also, instead of lifting holding table 31 and lift arms 32a, 32b, 32c, and 32d or instead of lifting only lift arms 32a, 32b, 32c, and 32d, it is acceptable to configure so that turntable 22 is lowered.

Also, in the embodiment described above, head section 5 is composed, and wafer 6 and a chip 8 are pinched and held by backup section 4 and head section 5 and bonded, but it is acceptable to configure so that head section 5 is not composed, and multiple chips 8 are arranged on wafer 6 and heated by backup section 4 in sequence, and bonded.

Additionally, it is acceptable that after a portion of wafer 6 (other than the portion that is located at opening section K5) is pre-heated at a low temperature, the portion which is pinched and held by head section 5 and backup section 4 is locally full-heated. It is possible to perform bonding effectively by applying pre-heating and full-heating in this way.

Also, the lifting mechanism of backup section 4 is not limited to be a lifting mechanism of lift cams; any configuration is acceptable.

Additionally, the drive motor is not limited to be a shaft motor or a servomotor; a stepping motor or other drive mechanism is also acceptable. Also the lifting mechanism is not limited to be the embodiment described above; other configurations are acceptable.

Additionally, it may be configured such that a location recognizing section, which detects the specified locations of wafer 6 and chip 8, is also equipped, and the location recognizing section is inserted between wafer 6 and chip 8, and the location detection and the location adjustment are carried out before wafer 6 and a chip 8 are bonded so that the specified locations of chip 8 are aligned to the specified locations on wafer 6.

Also, in the embodiment described above, a mounting apparatus that is equipped with a plane adjusting mechanism on backup section 4 is described, but a mounting apparatus that comprises the plane adjusting mechanism on head section 5 and/or the plane adjusting mechanisms on both head section 5 and backup section 4 is also acceptable. Additionally, the heater may be composed on either head section 5 or backup section 4 in any way.

Also, the standard plane for copying is not limited to be composed on holding section 60 of head section 5; it is acceptable to be composed on the upper surface of turntable 22, and also, a specified portion of the bottom surface of turntable 22 may be the standard plane for copying.

Also, the bonding method used to bond object-to-be-mounted is not limited to heating; ultrasonic vibration bonding, bonding by pressure, and other bonding methods are applicable. Additionally, any combination of them is applicable.

Additionally, it may be a configuration that is composed of the present mounting apparatus other than an apparatus used for the bonding process.

Also, in the embodiment described above, chip 8, which has melting metal bumps 7 and are object-to-be-mounted, and wafer 6 are bonded, but substances of the bumps may be Cu, Al, lead-tin solder, etc. or any other substances. Also, object-to-be-mounted are not limited to bumps; it is acceptable to be bonded by lead-tin solders, heat-hardened resins, heat-meltdown resins, etc. For example, it is acceptable that after the entire surface of wafer 6 is applied with heat-hardened resin in advance, chip 8, the active surface of which are facing up, are placed in sequence and heated, and then bonded. In this case, if the entire surface of wafer 6 is heated, the heat-hardened resin may have been hardened just before the completion of bonding and there may be a possibility that chip 8 cannot be bonded, but according to the present embodiment, because heating is applied on a local area only as described above, the heat-hardened resin has not hardened at the last minute of the completion of bonding, and the bonding of wafer 6 and chip 8 can be carried out accurately.

Also, substrates placed on the holding pedestal are not limited to wafers; they may be, for example, grass substrates, resin substrates and silicon substrates which have circuit patterns, and resin films, and/or they may be combined and composed as layers. Also, if a substrate is thin, it may be a stainless plate with a substrate adhered.

Moreover, the object-to-be-mounted with parts, etc. are not limited to chip with bump; they may be other electronic part and device, resin substrate, circuit board, etc., and the object-to-be-mounted may be any size and shape. Also, as stated previously, substrates and part, etc. may be those that are composed of a plurality of objects-to-be-mounted that are laid on top of each other.

The present invention is widely applicable to such technologies that are utilized to mount an object-to-be-mounted that has a part, such as a semiconductor, a chip, an electronic part, etc., on substrate.

The invention claimed is:

1. A mounting apparatus for mounting an object-to-be-mounted on a substrate, said mounting apparatus comprising:
a holding pedestal which has an opening section on a portion of the holding pedestal, the substrate being placed on at least a portion of the peripheral of the opening section of an upper surface of the holding pedestal;
a holding section that holds the substrate so that the holding pedestal can be moved relative to the substrate;
a drive mechanism that moves the holding pedestal so that the opening section is moved relative to the substrate under a condition that the substrate is being held by the holding section,
a backup section positioned under the holding pedestal so that the backup section contacts a bottom surface of the substrate locally through the opening section; and
a head section that pinches the substrate and the object-to-be-mounted against the backup section at a position where the backup section contacts a bottom surface of the substrate,
an area of the opening section of the holding pedestal being smaller than an entire area of the substrate, and the opening section being moved by the drive mechanism so that an area of a track of the opening section becomes larger than the area of the substrate at a place where the substrate is included.

2. A mounting apparatus for mounting an object-to-be-mounted on a substrate, said mounting apparatus comprising:
a holding pedestal which has an opening section on a portion of the holding pedestal, the substrate being placed on at least a portion of the peripheral of the opening section of an upper surface of the holding pedestal;
a holding section that holds the substrate so that the holding pedestal can be moved relative to the substrate;
a drive mechanism that moves the holding pedestal so that the opening section is moved relative to the substrate under a condition that the substrate is being held by the holding section,
wherein the holding section comprises:
a plurality of retainers which can freely retain and release a plurality of portions of the peripheral of the substrate; and
lifting/lowering height adjustment devices that lift and lower each of the retainers and/or the holding pedestal,
wherein the holding pedestal can be moved by lifting and lowering each of the retainers and/or the holding pedestal by actuation of the lifting/lowering height adjustment devices, and
wherein the opening section can be moved by the drive mechanism so that an area of a track of the opening section becomes larger than an entire area of the substrate at a place where the substrate is included.

3. The mounting apparatus according to claim 1, wherein the holding section comprises:
lifting/lowering height adjustment devices comprising a plurality of air-jet nozzles which are disposed throughout the holding pedestal so as to receive air therethrough which lift and lower the substrate that is placed on the holding pedestal.

4. The mounting apparatus according to claim 2 or 3, further comprising:
location adjusting devices for arranging a location detection section that is composed on the substrate to a predetermined specified location after detecting the location detection section when the substrate is lowered from the place where the substrate was kept lifted from the holding pedestal, and placed on the holding pedestal by the lifting/lowering height adjustment devices.

5. The mounting apparatus according to claim 4, wherein the opening section is composed of a shape that includes the center of the substrate and a portion of the peripheral of the substrate, and the drive mechanism rotates the holding pedestal by a specified angle.

* * * * *